United States Patent
Rasmussen et al.

(10) Patent No.: US 9,779,753 B2
(45) Date of Patent: Oct. 3, 2017

(54) METHOD AND APPARATUS FOR ATTENUATING UNDESIRED CONTENT IN AN AUDIO SIGNAL

(71) Applicant: GN Netcom A/S, Ballerup (DK)

(72) Inventors: Erik Witthøfft Rasmussen, Ballerup (DK); Martin Rung, Ballerup (DK); Rasmus Kongsgaard Olsson, Ballerup (DK)

(73) Assignee: GN NETCOM A/S (DK)

( * ) Notice: Subject to any disclaimer, the term of this patent is extended or adjusted under 35 U.S.C. 154(b) by 111 days.

(21) Appl. No.: 14/789,351

(22) Filed: Jul. 1, 2015

(65) Prior Publication Data
US 2017/0004846 A1 Jan. 5, 2017

(30) Foreign Application Priority Data

Jul. 2, 2014 (EP) ..................................... 14175416

(51) Int. Cl.
*H04B 15/00* (2006.01)
*H04R 3/00* (2006.01)
(Continued)

(52) U.S. Cl.
CPC ...... *G10L 21/0324* (2013.01); *G10L 21/0232* (2013.01); *H04R 3/00* (2013.01)

(58) Field of Classification Search
CPC ..... G10L 19/00; G10L 19/02; G10L 19/0204; G10L 25/18; G10L 21/0208;
(Continued)

(56) References Cited

U.S. PATENT DOCUMENTS

2006/0196337 A1* 9/2006 Breebart ........... G06F 17/30743
84/1
2007/0110258 A1* 5/2007 Kimijima .................. H04S 7/30
381/97
(Continued)

FOREIGN PATENT DOCUMENTS

GB 2456297 7/2009

OTHER PUBLICATIONS

Extended European Search Report for European application No. 14175416.8 dated Feb. 4, 2015.

*Primary Examiner* — Thang Tran
(74) *Attorney, Agent, or Firm* — Altera Law Group, LLC

(57) ABSTRACT

A method for attenuating undesired content in an audio signal and to an apparatus adapted to attenuate undesired content in an audio signal.
The method has
receiving an audio input signal ($S_i$);
providing a main audio signal ($S_a$) in dependence on the audio input signal ($S_i$);
determining an input level signal ($L_n$) indicating a signal level ($L_{n,i}$) of the main audio signal ($S_a$);
applying a frequency-dependent gain to the main audio signal ($S_a$) to provide an audio output signal ($S_o$);
providing an analysis signal ($S_n$) in dependence on the audio input signal ($S_i$);
determining a classification signal ($S_c$) indicating the presence in the analysis signal ($S_n$)
determining a threshold control signal ($S_t$) indicating a frequency-dependent level threshold (72, 75, 76, $T_f$) for multiple frequency subbands; and
determining the frequency-dependent gain in dependence on signal levels ($L_{n,i}$).

18 Claims, 7 Drawing Sheets

(51) Int. Cl.
*G10L 21/0324* (2013.01)
*G10L 21/0232* (2013.01)

(58) Field of Classification Search
CPC ........ H04R 2430/03; H04R 3/00; H04R 3/04;
H03G 9/005; H03G 9/025; H04S 2420/07
See application file for complete search history.

(56) References Cited

U.S. PATENT DOCUMENTS

| | | | |
|---|---|---|---|
| 2010/0086148 A1* | 4/2010 | Hung | H03G 5/165 |
| | | | 381/98 |
| 2011/0150242 A1 | 6/2011 | Zong et al. | |
| 2013/0136282 A1* | 5/2013 | McClain | H03G 3/32 |
| | | | 381/316 |
| 2014/0016791 A1 | 1/2014 | Smith et al. | |
| 2015/0058010 A1* | 2/2015 | Gunawan | G10L 21/0316 |
| | | | 704/236 |
| 2015/0373453 A1* | 12/2015 | Geiger | H04R 3/00 |
| | | | 381/71.1 |

* cited by examiner

METHOD AND APPARATUS FOR ATTENUATING UNDESIRED CONTENT IN AN AUDIO SIGNAL

TECHNICAL FIELD

The present invention relates to a method for attenuating undesired content in an audio signal and to an apparatus adapted to attenuate undesired content in an audio signal. The invention may be used to reduce adverse effects on a user caused by undesired or potentially harmful audio signals received from an audio communication network, such as e.g. a telephone network, and may advantageously be implemented in headsets and other audio communication apparatus or systems that can receive audio signals from an audio communication network and provide corresponding sound signals to one or more users, and/or in components of/for such apparatus or systems.

BACKGROUND ART

Audio signals received from audio communication networks often contain signals that when converted to sound may cause physical damage to a listener's ears or cause other symptoms, such as acoustic shock. The prior art comprises several disclosures of means for preventing such undesired or potentially harmful content from reaching the ears of the listeners.

In the article, "Subband-Based Acoustic Shock Limiting Algorithm On A Low-Resource DSP System" from "Proc. EUROSPEECH", 2003, pp. 2869-2871, Choy et al. disclose an algorithm that processes the input signal in both the time and frequency domains. This approach allows the algorithm to detect sudden increases in sound level (time-domain), as well as frequency-selectively suppressing shock disturbances in the frequency domain. The unaffected portion of the sound spectrum is thus preserved as much as possible. A simple algorithm calibration procedure is proposed to satisfy different sound pressure level (SPL) limit requirements for different communication equipment. The implemented algorithm limits narrowband SPL at different frequencies to predefined limits. Limiting is accomplished by computing subband gains in dependence on subband levels. When a shock is detected in a subband, the corresponding subband level and gain are computed with a shorter averaging time; when no shock is detected in a subband, the corresponding subband level and gain are computed with a longer averaging time. The authors further propose adding broadband shock disturbance limiting ability, e.g. by making the gain calculation adaptive to the flatness of the signal spectrum. Finally, the authors suggest a possible approach to incorporating detection and virtually elimination of periodic acoustic shock disturbance in each subband.

U.S. Patent Application 2005/0018862 discloses a method and an apparatus that may control the exposure of a listener to narrow-band signals in an audio signal. An amplifying device detects the presence of one or more high-pitched narrow-bandwidth signals within audio telephony signals, in isolation or in the presence of speech signals, and performs rapid, selective attenuation of the one or more narrow-bandwidth signals. A narrow-band signal may be detected based on whether the ratio of the signal level in a particular frequency region to the signal level in nearby higher and lower frequency regions exceeds a predetermined threshold. Attenuation is made by band-reject filters having centre frequencies that approximately match the frequencies closest to the frequencies of the shrieks detected. The degree of attenuation provided at the frequency of the shriek may be progressively increased as the duration of the shriek increases.

U.S. Pat. No. 7,565,283 B2 discloses a method of controlling potentially harmful signals in a signal arranged to convey speech, the method including the steps of: analysing the signal to determine features of the signal; analysing the signal to determine if it is conveying a speech signal; if the signal is determined to be conveying a speech signal then establishing characteristics of the signal based on the analysed features of the signal; and if a feature of the signal exceeds a corresponding established characteristic then controlling the signal to reduce the excess. The features may include any measurable feature including the amplitude of the signal, the power of the signal, the loudness of the signal, the amplitude of the signal in particular frequency bands, the power of the signal in particular frequency bands, and the specific loudness of the signal; all of the aforementioned being measured on a time dependent basis. By this method, the signal is controlled relative to the characteristics previously determined from the signal when it was conveying speech. If the signal exhibits features outside the established characteristics then it is controlled. Hence, reduction in the amplitude of potentially harmful signals may be provided. Further, control of potentially harmful signals may be provided independent of the sensitivity of the specific sound reproduction equipment employed by the user.

While the above cited disclosures provide protection against several types of undesired or potentially harmful content and at the same time a significant degree of preservation of desired signal content, there is still a need for improvement.

DISCLOSURE OF INVENTION

It is an object of the present invention to provide an improved method for attenuating undesired content in an audio signal. It is further object of the present invention to provide an improved apparatus adapted to attenuate undesired content in an audio signal.

These and other objects of the invention are achieved by the invention defined in the independent claims and further explained in the following description. Further objects of the invention are achieved by embodiments defined in the dependent claims and in the detailed description of the invention.

The terms "sound" and "sound signal" refer to signals propagating in media by means of variation of pressure or particle density. The term "audio signal" refers to a signal directly or indirectly derived from a sound signal, to a signal that is directly or indirectly transformed into a sound signal and/or to a signal provided for such a transformation. An audio signal may itself be a sound signal. An audio signal may constitute or comprise an arbitrary representation of a sound signal, such as e.g. an electric signal, an optical signal, a radio frequency signal, an inductive signal, a capacitive signal or an ultrasound signal, and the sound signal may be represented or encoded e.g. as an analog signal, a digital signal, a modulated signal etc.

Within this document, the singular forms "a", "an", and "the" are intended to include the plural forms as well (i.e. to have the meaning "at least one"), unless expressly stated otherwise. Likewise, the term "any" is intended to include both the singular and the plural form, unless expressly stated otherwise. Correspondingly, the terms "has", "includes", "comprises", "having", "including" and "comprising" specify the presence of respective features, operations, elements and/or components, but do not preclude the presence or addition of further entities. The term "and/or" generally includes any possible combination of one or more of the associated items. Steps or operations of any method disclosed herein need not be performed in the order disclosed, unless this is expressly stated.

Furthermore, when an element or entity is referred to as being "connected" or "coupled" to another element or entity, this includes direct connection (or coupling) as well as connection (or coupling) via intervening elements or entities, unless expressly stated otherwise. Also, unless expressly stated otherwise, when a signal is referred to as being "provided" or "conveyed" by a first entity to a second entity, this includes directly or indirectly transmitting the signal in its original form as well as any direct or indirect transmission that modifies the original signal and/or converts the signal into another domain and/or representation before it arrives at the second entity, provided that the information comprised by the signal received by the second entity is sufficient for the second entity to perform the specified actions with respect to the signal.

Ordinal attributes like "first", "second", "primary", "secondary", "main" and "auxiliary" are intended to allow distinguishing between different entities, and should not be construed as implying any order, hierarchy, dependency or precedency unless expressly stated otherwise.

BRIEF DESCRIPTION OF THE DRAWINGS

The invention will be explained in more detail below in connection with preferred embodiments and with reference to the drawings in which.

The figures are schematic and simplified for clarity, and they just show details essential to understanding the invention, while other details may be left out. Where practical, like reference numerals or literal identifiers are used for identical or corresponding parts.

MODE(S) FOR CARRYING OUT THE INVENTION

Figure 1:
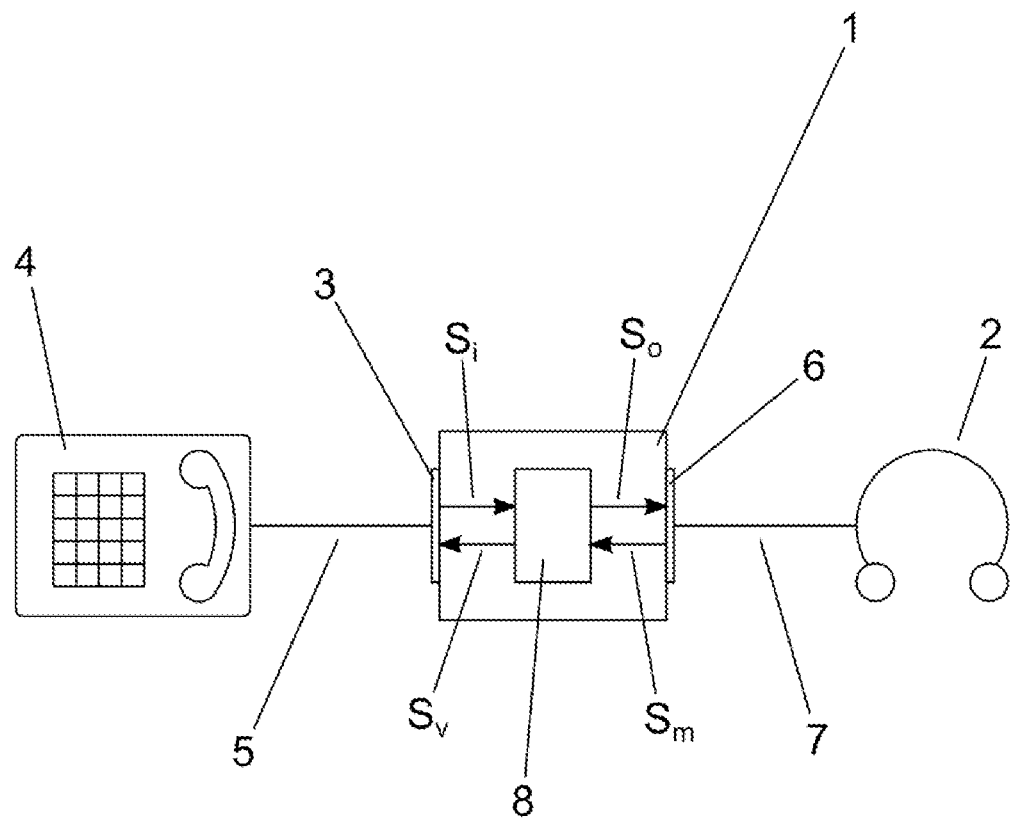
FIG. 1 shows an embodiment of an apparatus according to the invention.

FIG. 1 shows a signal conditioner 1 for a headset 2. The signal conditioner 1 comprises a telephone connector 3 detachably connected to a desktop telephone 4 through an audio cable 5, a headset connector 6 detachably connected to the headset 2 through a headset cable 7 and a signal processor 8 connected to receive an audio input signal $S_i$ from the desktop telephone 4 through the telephone connector 3 and provide a corresponding audio output signal $S_o$ to the headset 2 through the headset connector 6. The signal processor 8 is further connected to receive a microphone signal $S_m$ from the headset 2 through the headset connector 6 and provide a corresponding voice signal $S_v$ to the desktop telephone 4 through the telephone connector 3. The signal conditioner 1 may comprise further features (not shown) that are well known in the art, such as e.g. a power supply, one or more control elements, one or more status indicators, a display, etc.

The desktop telephone 4 is connected to a telephone network (not shown) from which the desktop telephone 4—and thus the headset 2—may receive desired signals, such as speech from a remote party, as well as undesired signals, such as e.g. tone bursts, click noises, excessively loud speech and other noise signals. Such undesired signals may annoy or even harm the user of the headset 2 when the audio output signal $S_o$ is converted into a sound signal by the headset 2. The signal conditioner 1 may advantageously be used to attenuate such undesired signals and thus reduce their effect on the user. Since the desktop telephone 4 may itself also produce undesired signals, the signal conditioner 1 is preferably connected between the desktop telephone 4 and the headset 2 as shown in FIG. 1. The signal conditioner 1 may, however, be arranged at any point in the audio signal path between telephone network and the headset 2 or the earphones comprised by the headset 2.

Figure 2:
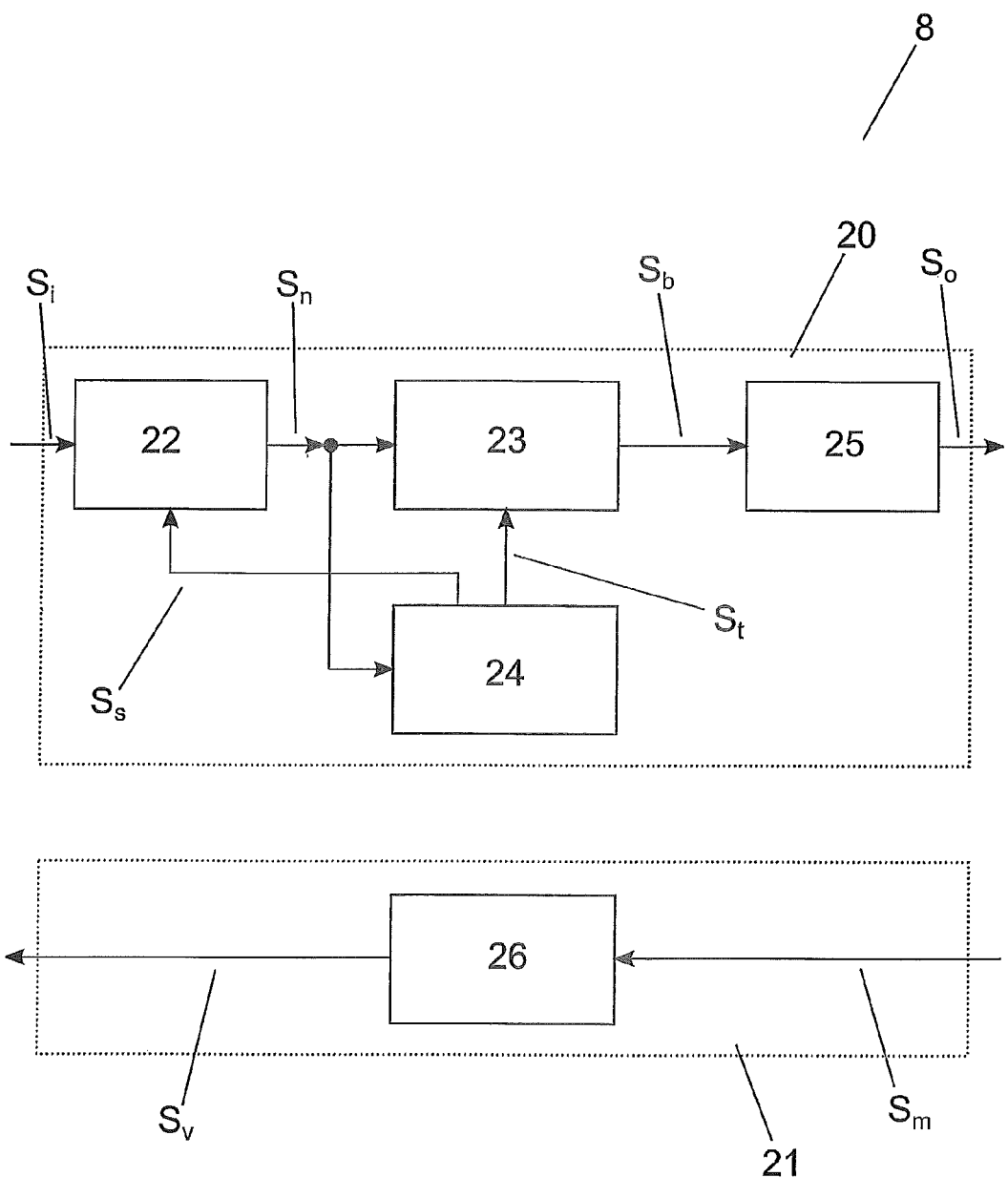
FIG. 2 shows details of the apparatus of FIG. 1.

As shown in FIG. 2, the signal processor 8 comprises a reception path 20 and a transmission path 21. The reception path 20 comprises a speech level normalizer 22 that provides a normalized signal $S_n$ in dependence on the audio input signal $S_i$ and a speech level control signal $S_s$, an audio limiter 23 that provides a limited signal $S_b$ in dependence on the normalized signal $S_n$ and a threshold control signal $S_t$, an audio analyser 24 providing the speech level control signal $S_s$ and the threshold control signal $S_t$ in dependence on an analysis signal which in the shown embodiment is equal to the normalized signal $S_n$ as well as an output processor 25 providing the audio output signal $S_o$ in dependence on the limited signal $S_b$. The transmission path 21 comprises an input processor 26 that provides the voice signal $S_v$ in dependence on the microphone signal $S_m$.

The reception path 20 may preferably be used to process audio signals received from an audio communication network, while the transmission path 21 may preferably be used to process audio signals transmitted or provided to an audio communication network.

The signal conditioner 1 may be used to attenuate undesired signals originating from any type of audio communication network, such as e.g. a telephone network, a mobile/cellular phone network, an IP telephony network, a radio communication network, etc. Correspondingly, the signal conditioner 1 may be connectable to receive the audio input signal $S_i$ from a gateway device providing an interface to an audio communication network. The gateway device may be e.g. a desktop telephone 4, a base station for a wired or wireless headset or handset, a mobile phone, a radio receiver, a desktop computer, etc. In some embodiments, the signal conditioner 1 may be comprised by a gateway device 4.

The signal conditioner 1 may further be connectable to provide the audio output signal $S_o$ to any type of sound interface device that may provide a corresponding sound signal to a user's ear, such as e.g. a wired or wireless headset 2, a wired or wireless handset, an earphone, a headphone, a speakerphone, a telephone, a mobile phone, etc. In some embodiments, the signal conditioner 1 may be comprised by a sound interface device, such as e.g. a headset 2, a headset base or a desktop computer.

Figure 3:
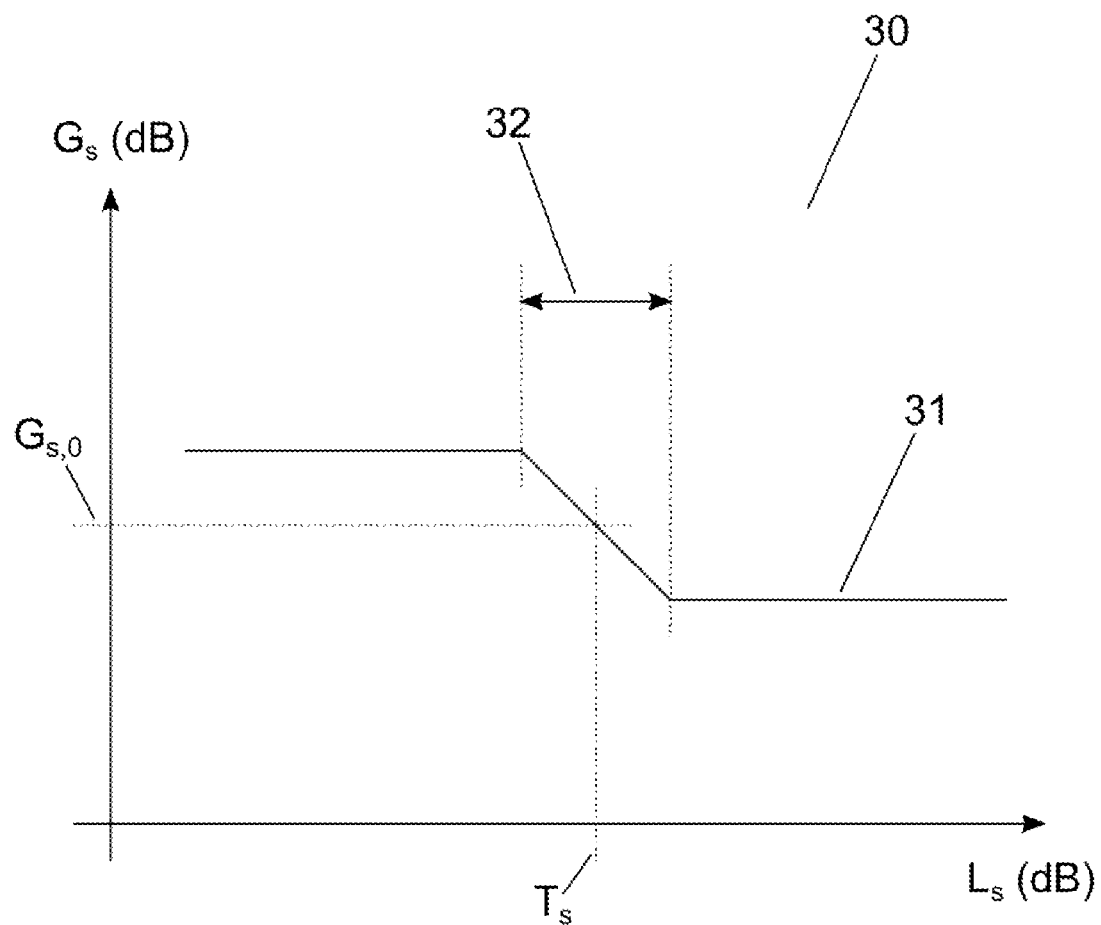
FIG. 3 illustrates functions of the apparatus of FIG. 1.

The diagram 30 shown in FIG. 3 illustrates the functioning of the speech level normalizer 22, which determines a level $L_s$ of speech in the audio input signal $S_i$ and applies a speech gain $G_s$ to the audio input signal $S_i$ to provide the normalized signal $S_n$. The speech level normalizer 22 may preferably determine the speech gain $G_s$ in dependence on a comparison of the determined speech level $L_s$ with a predefined target speech level $T_s$. For instance, the speech level normalizer 22 may determine the speech gain $G_s$ according to the compensation curve 31: When the determined speech level $L_s$ equals a predefined target speech level $T_s$, the speech gain $G_s$ is set to a default speech gain $G_{s,0}$; for determined speech levels $L_s$ within a predefined speech adaptation range 32 comprising the target speech level $T_s$, the speech gain $G_s$ is increased and/or decreased to compensate fully for the deviation between the determined speech level $L_s$ and the target speech level $T_s$; for determined speech levels $L_s$ outside the speech adaptation range 32, the speech gain $G_s$ is maintained at the value applying to the respective end of the speech adaptation range 32. The speech level normalizer 22 thus attenuates and/or amplifies the audio input signal $S_i$ to reduce a difference between a level of a speech signal in the resulting normalized signal $S_n$ and the target speech level $T_s$. The speech adaptation range 32 preferably spans about 20 dB, about 30 dB or about 40 dB, such that some adaptation to a varying speech level $L_s$ in the audio input signal $S_i$ can be achieved without causing too much increase in the dynamic range of other signals. The size of the speech adaptation range 32 may preferably be determined from knowledge about typical speech level variations in the audio communication network and/or the gateway device 4 to which the signal conditioner 1 is or will be connected. The speech level normalizer 22 preferably applies averaging such that the speech gain $G_s$ adapts with a relatively large time constant, such as e.g. about 1 s, about 2 s, about 5 s or larger, or with a maximum gain change speed of about ±3 dB/s, about ±2 dB/s or about ±1 dB/s.

The speech level normalizer 22 preferably interrupts or slows down the adaptation to the speech level $L_s$, e.g. by interrupting or slowing down the determination of the speech level $L_s$, the attenuation of the audio input signal $S_i$ and/or the amplification of the audio input signal $S_i$, in dependence on the speech level control signal $S_s$ from the audio analyser 24 indicating a corresponding speech level control command.

Figure 4:
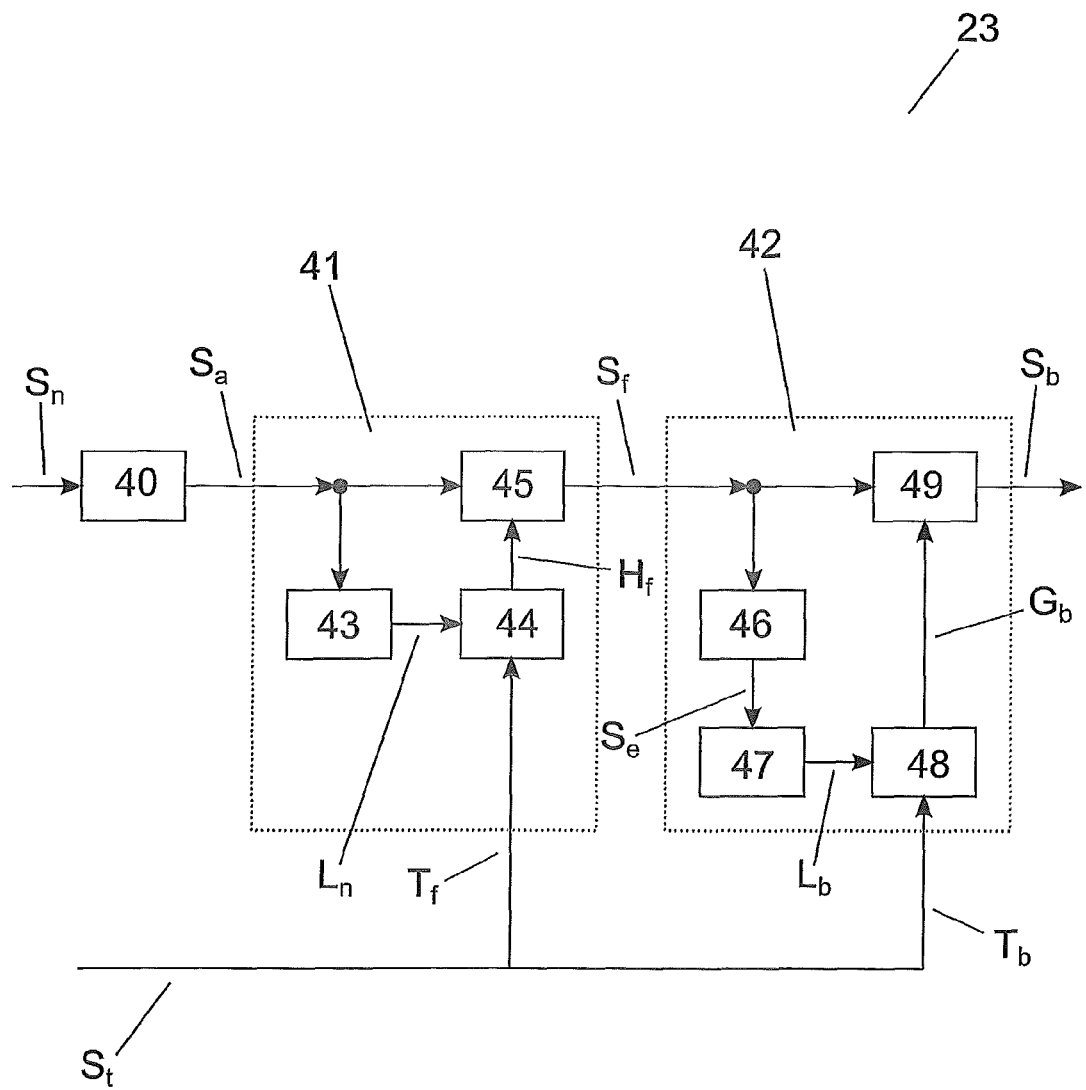
FIG. 4 shows further details of the apparatus of FIG. 1.

As shown in FIG. 4, the audio limiter 23 comprises a delay buffer 40, a narrowband limiter 41 and a broadband limiter 42. The delay buffer 40 applies a predefined time delay $t_d$ to the normalized signal $S_n$ to provide a main audio signal $S_a$. The narrowband limiter 41 performs narrowband limiting of the main audio signal $S_a$ to provide a filtered signal $S_f$, and the broadband limiter 42 performs broadband limiting of the filtered signal $S_f$ to provide the limited signal $S_b$. The frequency-dependent level threshold $T_f$ applied by the narrowband limiter 41 and the broadband level threshold $T_b$ applied by the broadband limiter 42 are indicated by the threshold control signal $S_t$, which is received from the audio analyser 24. The time delay $t_d$ applied by the delay buffer 40 delays the main audio signal $S_a$ with respect to the analysis signal $S_n$ provided to the audio analyser 24, such that any delays caused by the signal analysis are compensated for.

The narrowband limiter 41 comprises a spectrum analyser 43, a filter controller 44 and an audio filter 45. The spectrum analyser 43 determines an input level signal $L_n$ that indicates a signal level $L_{n,i}$ of the main audio signal $S_a$ for each of multiple frequency subbands. The filter controller 44 compares the indicated input levels $L_{n,i}$ with the frequency-dependent level threshold $T_f$ and determines a set $H_f$ of filter coefficients $H_{f,j}$ for the audio filter 45 in dependence on the result of the comparison. The filter coefficients $H_{f,j}$ are determined such that the audio filter 45 attenuates frequency subbands of the main audio signal $S_a$ for which the signal level $L_{n,i}$ indicated by the input level signal $L_n$ exceeds the corresponding portion $T_{f,i}$ of the frequency-dependent level threshold $T_f$ and leaves the remaining frequency subbands unchanged. The level of the filtered signal $S_f$ is thus upwardly limited in dependence on its frequency to levels close to the frequency-dependent level threshold $T_f$ as explained in detail further below.

The broadband limiter 42 comprises an emphasis filter 46, a broadband level detector 47, an attenuation controller 48 and an attenuator 49. The emphasis filter 46 applies a predefined frequency filter to the filtered signal $S_f$ to provide an emphasized signal $S_e$ wherein one or more frequency ranges are attenuated in order to reduce the sensitivity of the broadband limiter 42 at frequencies where users are typically less sensitive to undesired or harmful signals. The emphasis filter 46 may for instance attenuate a low-frequency range, such as e.g. frequencies below 600 Hz by about 12 dB, since users are typically much less sensitive to acoustic noise at such low frequencies, leave unaltered a high-frequency range, such as e.g. frequencies above 5 kHz, and provide a smooth transition between the low- and high-frequency ranges. The broadband level detector 47 determines a broadband signal level $L_b$ of the emphasized signal $S_e$. The attenuation controller 48 compares the broadband signal level $L_b$ with the broadband level threshold $T_b$ and determines a broadband gain $G_b$ for the attenuator 49 in dependence on the result of the comparison. The broadband gain $G_b$ is set to a default broadband gain value $G_{b,0}$ when the determined broadband signal level $L_b$ is below the broadband level threshold $T_b$ and to a value below the default broadband gain value $G_{b,0}$ when the determined broadband signal level $L_b$ exceeds the broadband level threshold $T_b$. The attenuator 49 applies the broadband gain $G_b$ to the filtered signal $S_f$, and the broadband level of the limited signal $S_b$ is thus upwardly limited to levels close to the broadband level threshold $T_b$ as explained in detail below.

Figure 5:
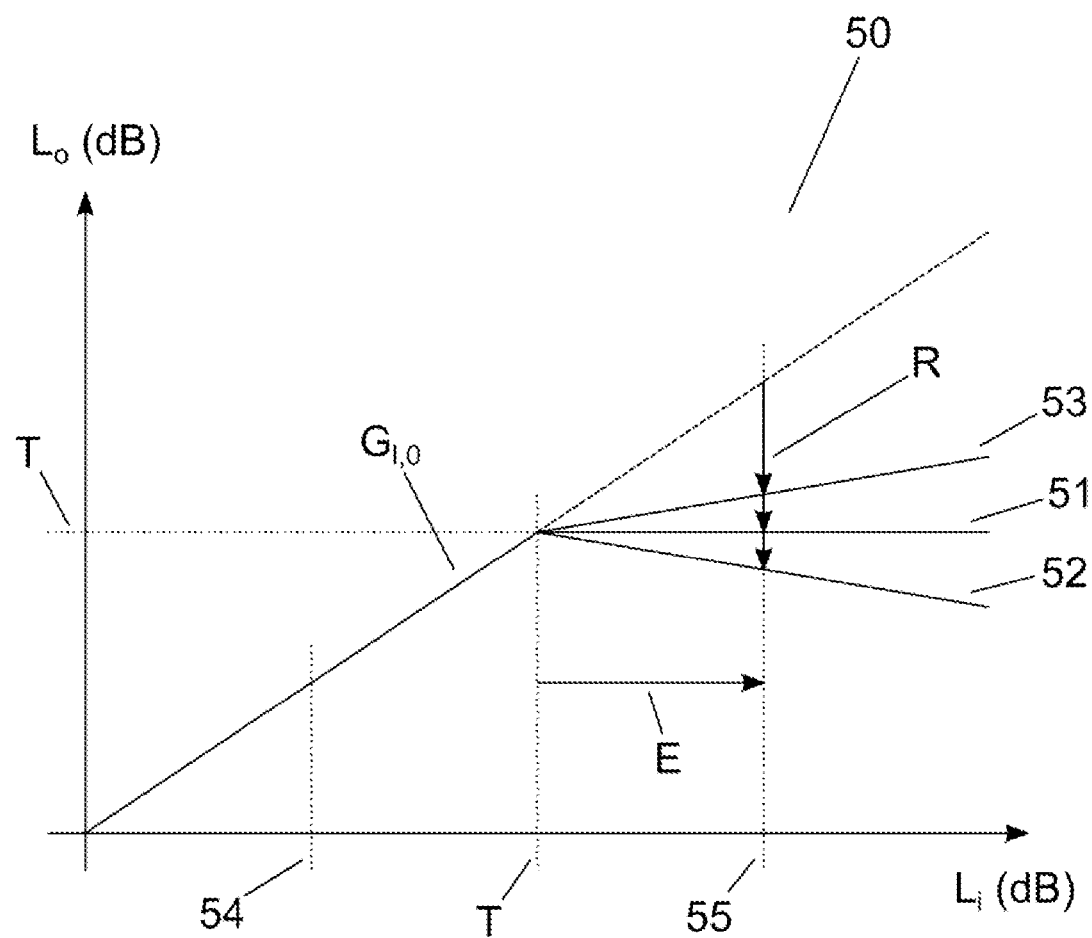
FIG. 5 illustrates further functions of the apparatus of FIG. 1.

The diagram 50 shown in FIG. 5 illustrates the general functioning of an ideal limiter which receives an input signal with an input level $L_i$ and provides an output signal with an output level $L_o$. Three curves illustrate respectively a fully compensating limiter 51, an overcompensating limiter 52 and a partially compensating limiter 53. Each of the limiters 51, 52, 53 applies a default gain $G_{l,0}$ of 0 dB (unity gain) for input signals 54 with input levels $L_i$ below a level threshold T and reduces the gain for input signals 55 with input levels $L_i$ above the level threshold T. Input signals 54 with input levels $L_i$ below the level threshold T thus pass any of the three limiters 51, 52, 53 unaltered. In all three limiters 51, 52, 53, the gain reduction R (from the default gain $G_{l,0}$) is proportional to the excess E, i.e. the difference between the input level $L_i$ and the level threshold T, for input signals 55 with input levels $L_i$ above the level threshold T.

In the fully compensating limiter 51, the gain reduction R equals the excess E, and the output level $L_o$ is thus equal to the level threshold T for input signals 55 with input levels $L_i$ above the level threshold T. In the overcompensating limiter 52, the gain reduction R is larger than the excess E, and the output level $L_o$ is thus equal to the level threshold T for an input signal with an input level $L_i$ equal to the level threshold T, while input signals 55 with input levels $L_i$ higher than the level threshold T are attenuated to output levels $L_o$ below the level threshold T. In the partially compensating limiter 53, the gain reduction R is smaller than the excess E, and the output level $L_o$ is thus equal to the level threshold T for an input signal with an input level $L_i$ equal to the level threshold T, while input signals 55 with input levels $L_i$ higher than the level threshold T are attenuated to output levels $L_o$ above the level threshold T. The three limiters 51, 52, 53 thus cause level limitation with different degrees of compensation.

The narrowband limiter 41 may preferably be implemented as a fully compensating limiter 51. Alternatively, the narrowband limiter 41 may be implemented as an overcompensating limiter 52 or as a partially compensating limiter 53. In some embodiments, the degree of compensation may be frequency-dependent. The broadband limiter 42 may preferably be implemented as an overcompensating limiter 52. Alternatively, the broadband limiter 42 may be implemented as a fully compensating limiter 51 or as a partially compensating limiter 53. Note that in practical embodiments of the narrowband limiter 41 and the broadband limiter 42, processing delays may allow the actual output level to temporarily exceed the output level $L_o$ that a corresponding ideal limiter 51, 52, 53 would have provided. Such processing delays may e.g. be caused by averaging and other signal processing in the spectrum analyser 43, the filter controller 44, the emphasis filter 46, the broadband level detector 47 and/or the attenuation controller 48.

The narrowband limiter 41 preferably reacts to changes of the main audio signal $S_a$ with a relatively small time constant, such as e.g. about 2-5 ms, in order to prevent that sudden gain changes cause click sounds and other potentially annoying or harmful artefacts in the filtered signal $S_f$. The broadband limiter 42 preferably reacts immediately to level increases in the filtered signal $S_f$ in order to allow it to reliably suppress sudden or abrupt loud broadband signals in the filtered signal $S_f$. The broadband limiter 42 preferably reacts to level decreases in the filtered signal $S_f$ with a medium-sized time constant, such as e.g. about 50-100 ms or even larger.

Figure 6:
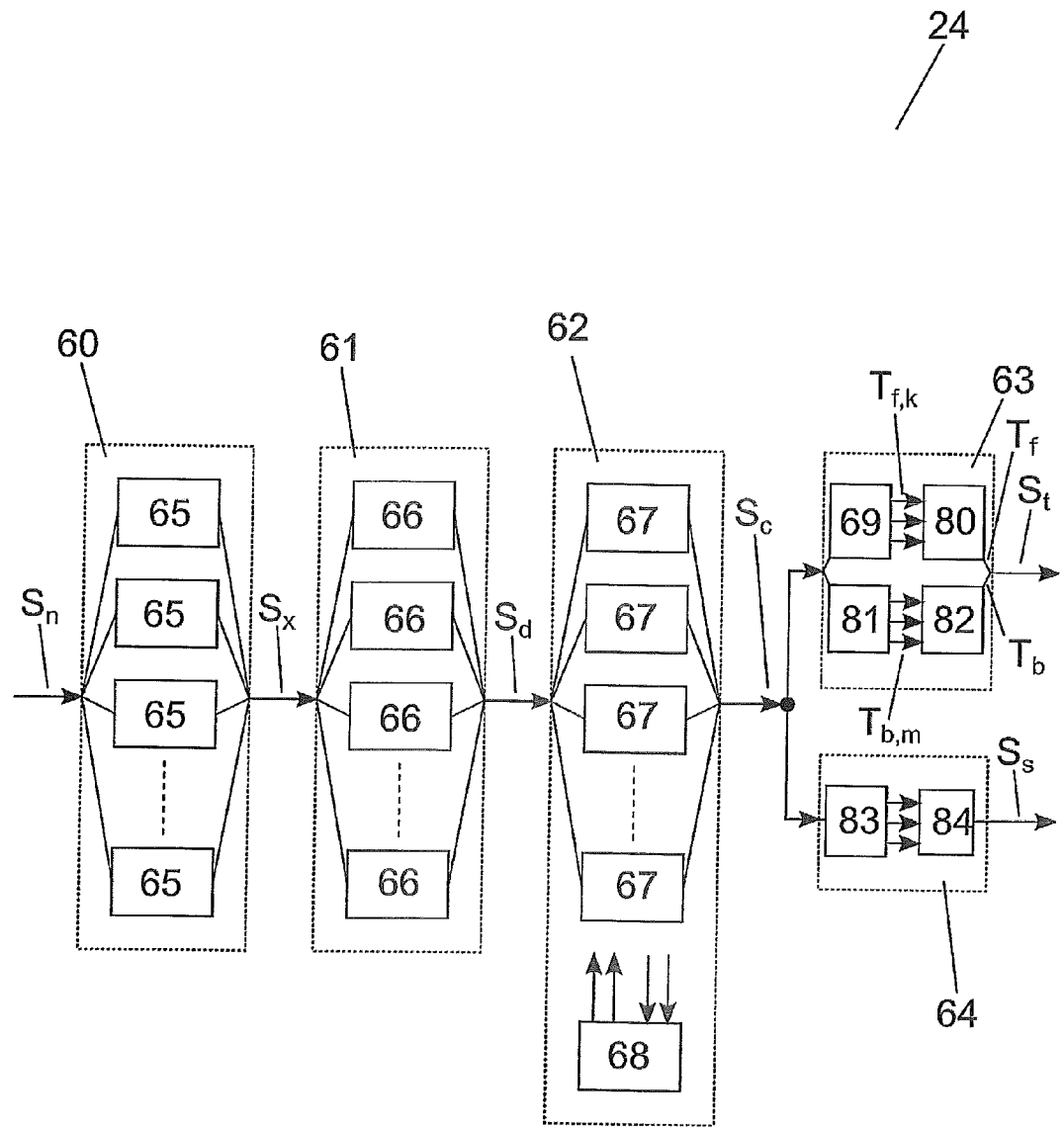
FIG. 6 shows further details of the apparatus of FIG. 1.

As shown in FIG. 6, the audio analyser 24 comprises a feature extractor 60 that provides a feature signal $S_x$ in dependence on the analysis signal $S_n$, a component detector 61 that provides a detector signal $S_d$ in dependence on the feature signal $S_x$, a signal classifier 62 that provides a classification signal $S_c$ in dependence on the detector signal $S_d$, a threshold controller 63 that provides the threshold control signal $S_t$ in dependence on the classification signal $S_c$ and a speech level controller 64 that provides the speech level control signal $S_s$ in dependence on the classification signal $S_c$.

The feature extractor 60 comprises one or more signal analysers 65. Each signal analyser 65 performs an analysis of the analysis signal $S_n$ and provides the analysis result as an individual feature signal in the feature signal $S_x$ provided by the feature extractor 60. The analyses performed by the respective signal analysers 65 may comprise any known audio feature extraction analysis, such as e.g. frequency analysis, computation of Short-Time Fourier Spectra (STFS), computation of cepstra, determination of broadband signal power and/or energy, determination of signal power and/or energy in high-pass and/or low-pass filtered versions of the analysis signal $S_n$, wavelet analysis and/or time averaging—e.g. of an STFS and/or other of the individual feature signals.

The component detector 61 comprises one or more, preferably two or more, signal detectors 66. Each signal detector 66 processes one or more of the individual feature signals and provides a detector output indicating the presence of a predefined signal component in the analysis signal $S_n$. Any signal detector 66 may further provide in its detector output an indication of one or more signal parameters, such as e.g. frequency, bandwidth, level, power and/or energy, characterizing a detected signal component. The one or more signal parameters are preferably copied or otherwise derived from one or more relevant individual feature signals. Each signal detector 66 provides its detector output as an individual component signal in the detector signal $S_d$, which thus comprises at least one or preferably at least two component signals. The processing performed by the signal detectors 66 may comprise any known audio component detection method, such as e.g. tone detection, DTMF signal detection, FAX or modem signal detection, white noise or coloured noise detection, transient noise detection, stationary noise detection, periodic noise detection, voiced speech detection and/or unvoiced speech detection. Each signal detector 66 may preferably process the respective individual feature signals using a statistical and/or a deterministic model, such as e.g. a Hidden Markov Model.

The signal classifier 62 comprises one or more, preferably two or more, class evaluators 67. Each class evaluator 67 evaluates the detector signal $S_d$ and provides an individual evaluation signal that indicates the presence in the analysis signal $S_n$ of one or more audio signals belonging to a predefined audio signal class assigned to the particular class evaluator 67. Any or each class evaluator 67 preferably further provides an indication of one or more signal parameters from the relevant detector signal or signals $S_d$ in its individual evaluation signal. The signal classifier 62 provides the individual evaluation signals in the classification signal $S_c$. Due to the stochastic nature of noise and processing errors occurring in audio communication networks, any detector output in the detector signal $S_d$ may be intermittent, meaning that it may temporarily indicate a particular signal component to be absent although an audio signal to which the signal component belongs is present in the input signal. In order to be able to handle intermittent detector outputs correctly, any or each class evaluator 67 may provide its individual evaluation signal in dependence on current values of the detector outputs and on previous values of the detector outputs. Any or each class evaluator 67 may e.g. comprise a state machine that sustains a value of its individual evaluation signal for a time following a change of a detector output that would otherwise have caused a change of the individual evaluation signal. This may allow the limiters 41, 42 to attenuate or limit undesired audio signals also under circumstances where a reliable detection of such undesired audio signals is difficult to accomplish. The sustaining period may end after a predefined time period, such as e.g. after 500 ms or after 1 s, or in dependence on detecting a change of a detector output.

Since the individual evaluation signals provided by the one or more class evaluators 67 may indicate the presence of audio signals belonging to multiple audio signal classes at the same time, the signal classifier 62 may comprise a conflict resolver 68 that determines which of the individual evaluation signals that shall be provided in the classification signal $S_c$. The conflict resolver 68 may e.g. apply a priority algorithm to multiple individual evaluation signals and/or feed one or more individual evaluation signals back as input to one or more of the class evaluators 67, e.g. as inputs to their state machines, and thereby cause a resolution of any conflicts.

Each class evaluator 67 is preferably adapted to determine the presence of audio signals belonging to a predefined audio signal class, such as e.g. desired tone signals, undesired tone signals, desired multi-tone signals, undesired multi-tone signals, noise signals, music signals, speech signals, loud speech signals, etc. The individual class evaluators 67 may apply any method known in the art for classifying an audio signal.

The threshold controller 63 determines the frequency-dependent level threshold $T_f$ in dependence on the one or more individual evaluation signals in the classification signal $S_c$ and provides the frequency-dependent level threshold $T_f$ in the threshold control signal $S_t$ to the narrowband limiter 41. The threshold controller 63 preferably comprises a mapper 69 that maps each predefined audio signal class into an individual frequency-dependent level threshold $T_{f,k}$, which may further depend on one or more signal parameters, such as e.g. frequency, bandwidth, level, power and/or energy, indicated in the one or more individual evaluation signals in the classification signal $S_c$. When an individual evaluation signal indicates the presence of a particular audio signal class, the mapper 69 preferably provides the corresponding individual frequency-dependent level threshold $T_{f,k}$ to a comparator 80, which compares the one or more provided individual frequency-dependent level thresholds $T_{f,k}$ with each other and within each frequency subband determines the frequency-dependent level threshold $T_f$ for the threshold control signal $S_t$ as the minimum of the provided individual frequency-dependent level thresholds $T_{f,k}$ within that frequency subband. The threshold controller 63 may preferably further provide a default frequency-dependent level threshold $T_{f,0}$ to the comparator 69, such that the frequency-dependent level threshold $T_f$ indicated in the threshold control signal $S_t$ is upwardly limited to the default frequency-dependent level threshold $T_{f,0}$, also during time periods wherein none of the individual evaluation signals indicate the presence of the respective audio signal class.

Figure 7:
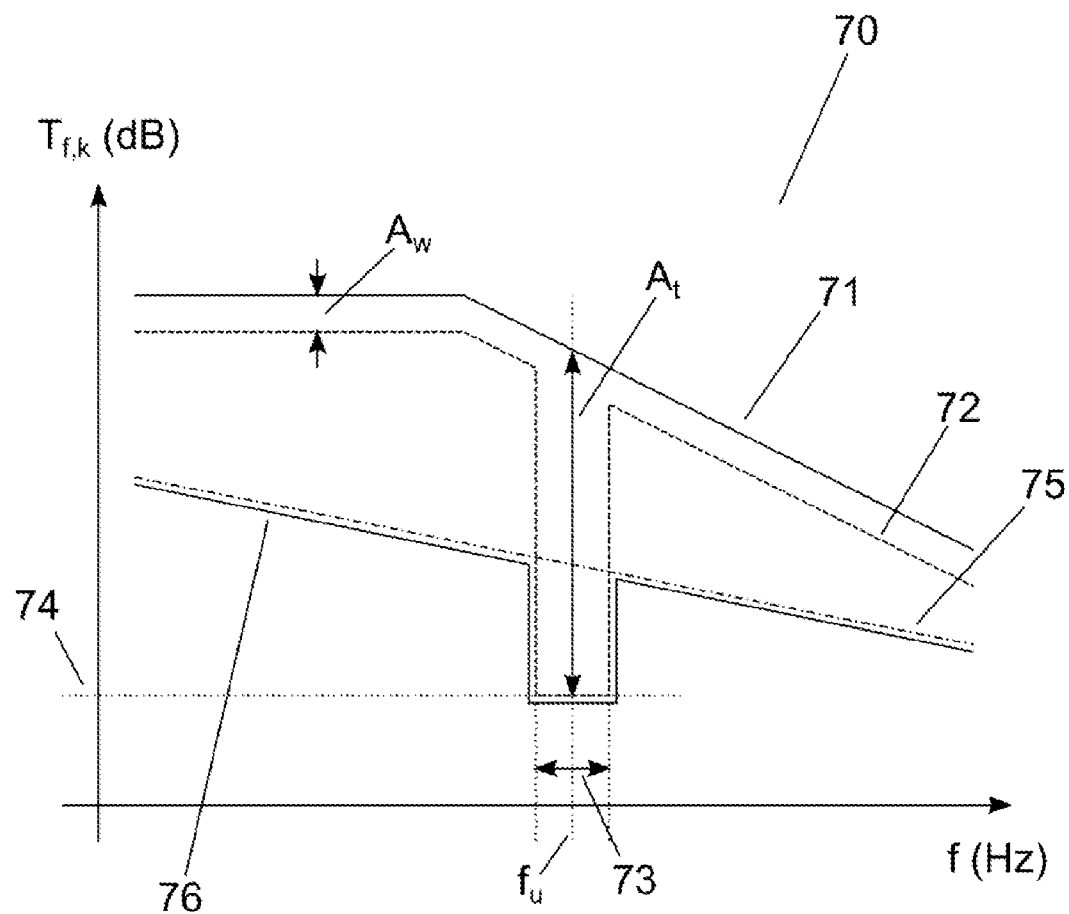
FIG. 7 illustrates further functions of the apparatus of FIG. 1.

The diagram 70 in FIG. 7 shows examples of preferred individual frequency-dependent level thresholds $T_{f,k}$. The default frequency-dependent level threshold $T_{f,0}$ is preferably determined as the lowest possible level where normal speech at a desired speech level is not attenuated. The default frequency-dependent level threshold $T_{f,0}$ may e.g. be determined to be about 10 dB or about 15 dB above an average desired speech level and may thus in general exhibit the frequency dependency indicated by the speech threshold curve 71. The tone threshold curve 72 indicates an individual frequency-dependent level threshold $T_{f,k}$ that the threshold controller 63 may provide when the classification signal $S_c$ comprises an evaluation signal indicating the presence of an undesired tone signal with a frequency $f_u$. Within a narrow frequency band 73 surrounding the tone frequency $f_u$, the tone threshold curve 72 may preferably be set to a tone threshold level 74 at a relatively large and frequency-independent predefined distance $A_t$ below the speech threshold curve 71. Alternatively, the tone threshold level 74 may be constant and independent of the speech threshold curve 71 or exhibit another frequency dependency than that of the speech threshold curve 71. The narrow frequency band 73 may comprise a single one or a small number, such as e.g. a number in the range three to fifteen, of consecutive ones of the multiple frequency subbands analysed by the spectrum analyser 43. The number of comprised subbands may increase with the tone frequency $f_u$ so that modulated tones can be reliably suppressed. The narrow frequency band 73 may thus have a size in the range between e.g. 5 Hz and 500 Hz depending on the tone frequency $f_u$. Outside the narrow frequency band 73, the tone threshold curve 72 may preferably be set to a level at a relatively small predefined distance $A_w$, such as e.g. 0 dB, 1 dB or 3 dB, below the speech threshold curve 71.

The noise threshold curve 75 indicates an individual frequency-dependent level threshold $T_{f,k}$ that the threshold controller 63 may provide when the classification signal $S_c$ comprises an evaluation signal indicating the presence of a wideband periodic noise signal. The noise threshold curve 75 prescribes a lower level threshold at higher frequencies than at lower frequencies, since users are typically less sensitive to the low-frequency components of such noise signals. The noise threshold curve 75 is preferably determined with a predefined value.

The threshold curve 76 indicates a frequency-dependent level threshold $T_f$ that the threshold controller 63 may provide when the classification signal $S_c$ comprises both an evaluation signal indicating the presence of an undesired tone signal with a frequency $f_u$ and an evaluation signal indicating the presence of a wideband periodic noise signal. At all frequencies, the frequency-dependent level threshold $T_f$ indicated by threshold curve 76 equals the lower one of the individual frequency-dependent level threshold $T_{f,k}$ indicated by the tone threshold curve 72 and the individual frequency-dependent level threshold $T_{f,k}$ indicated by the noise threshold curve 75. Note that the threshold curve 76 is slightly offset to improve readability of the diagram 70.

As shown in FIG. 6, the threshold controller 63 further determines the broadband level threshold $T_b$ in dependence on the one or more individual evaluation signals in the classification signal $S_c$ and provides the broadband level threshold $T_b$ in the threshold control signal $S_t$ to the broadband limiter 42. The threshold controller 63 preferably comprises a mapper 81 that maps each predefined audio signal class into an individual broadband level threshold $T_{b,m}$, and when an individual evaluation signal indicates the presence of a particular audio signal class, the mapper 81 preferably provides the corresponding individual broadband level threshold $T_{b,m}$ to a comparator 82, which provides the lower one of the provided individual broadband level thresholds $T_{b,m}$ as the broadband level threshold $T_b$. Similarly as for the frequency-dependent level threshold $T_f$, the threshold controller 63 preferably upwardly limits the broadband level threshold $T_b$ to a default broadband level threshold $T_{b,0}$ that allows speech at desired levels to pass without being limited. The mapper 81 may preferably map a respective individual broadband level threshold $T_{b,m}$ below the default broadband level threshold $T_{b,0}$ to each of one or more audio signal classes that comprise broadband signals, such as e.g. a white noise signal.

The speech level controller 64 determines the speech level control signal $S_s$ in dependence on the one or more individual evaluation signals in the classification signal $S_c$ and provides the speech level control signal $S_s$ to the speech level normalizer 22. The speech level controller 64 preferably comprises a mapper 83 that maps each audio signal class into an individual speech level control command, and when an individual evaluation signal indicates the presence of a particular audio signal class, the mapper 83 preferably provides the corresponding individual speech level control command to a comparator 84, which provides one of the provided individual speech level control commands in the speech level control signal $S_s$. The comparator 84 preferably prioritizes a provided individual speech level control command to interrupt adaptation over a provided individual speech level control command to slow it down, which it prioritizes over a provided individual speech level control command to perform adaptation.

Preferably, the speech level controller 64 by default provides a speech level control command indicating to the speech level normalizer 22 to perform speech-level normalization. When, however, one or more individual evaluation signals indicate the presence of an audio signal class that might disturb the speech-level normalization, the speech level controller 64 preferably provides a speech level control command indicating to the speech level normalizer 22 to interrupt, or a speech level control command to slow-down, the adaptation to the speech level. This may e.g. prevent that the speech level normalizer 22 attenuates the input audio signal $S_i$ during short noise bursts, which might cause subsequent speech to be incomprehensible to the user.

The speech level controller 64 may further in a similar way determine the target speech level $T_s$ in dependence on the one or more individual evaluation signals in the classification signal $S_c$ and provide the target speech level $T_s$ in the speech level control signal $S_s$ to the speech level normalizer 22. The speech level controller 64 may e.g. increase the target speech level $T_s$ when one or more individual evaluation signals indicate the presence of a steady noise signal that might deteriorate speech intelligibility.

The audio analyser 24 may further be adapted to receive an in-ear audio signal indicating a frequency-dependent sound level in an ear canal of a user and to determine the classification signal $S_c$, the frequency-dependent level threshold 72, 75, 76, $T_f$, the target speech level $T_s$ and/or the broadband level threshold $T_b$ in dependence on the in-ear audio signal. Thus, the signal processor 8 may detect and compensate for frequency- and time-dependent variations and/or deviations from target values of the sound level provided at the user's ear or ears.

The audio analyser 24 may further be adapted to receive an ambient noise signal indicating a frequency-dependent sound level in a user's ambient space and to determine the classification signal $S_c$, the frequency-dependent level threshold 72, 75, 76, $T_f$, the target speech level $T_s$ and/or the broadband level threshold $T_b$ in dependence on the ambient noise signal. Thus, the signal processor 8 may adjust its audio output level to the general sound level in the user's surroundings.

The output processor 25 may perform any known type of signal processing on the limited signal $S_b$, such as e.g. noise reduction or frequency shaping. The output processor 25 may further be connected to receive one or more signals from the input processor 26 and perform echo cancelling, side tone processing or the like in dependence on the one or more signals received from the input processor 26. The output processor 25 may further apply a gain to the limited signal $S_b$ in dependence on a volume control setting provided by the user, such that the user can set a preferred level of the sound signal provided by a headset 2 or other sound interface device. In some embodiments, the output processor 25 or at least the volume control portion may be arranged prior to the audio limiter 23 in the receive path 20.

The speech level normalization provided by the speech level normalizer 22 may—at least to some extent—compensate for varying speech levels of the remote party and/or varying gains and losses in the audio communication network connecting the parties, such that the audio limiter 23, the audio analyser 24 and/or the output processor 25 may operate on signals having a reasonably well defined level of speech. This may also motivate the user to maintain a constant volume control setting most of the time—or to vary the setting only within a limited range, such that the level limiting provided by the signal processor 8 results in a predictable and reliable protection against undesired or harmful signal content.

The input processor 26 may perform any known type of signal processing on the microphone signal $S_m$, such as e.g. noise reduction or frequency shaping. The microphone signal $S_m$ may comprise output signals from multiple microphones in the headset 2 or other sound interface device, and the input processor 26 may perform beamforming and/or other multi-microphone processing of the microphone signal $S_m$.

The signal conditioner 1 described above thus constitutes an embodiment of an apparatus for attenuating undesired content in an audio signal. Some examples of other embodiments of such an apparatus include the signal processor 8 described above, a combination of the signal conditioner 1 and a headset 2, a headset 2 comprising a signal processor 8 or a signal conditioner 1, a computer programmed to execute the functions of the signal processor 8 described above, etc. The apparatus preferably comprises a signal processor 8 connected to receive an audio input signal $S_i$ and adapted to: provide an analysis signal $S_n$ in dependence on the audio input signal $S_i$; provide a main audio signal $S_a$ in dependence on the audio input signal $S_i$; and apply a frequency-dependent gain to the main audio signal $S_a$ to provide an audio output signal $S_o$. The signal processor 8 preferably comprises: a spectrum analyser 43 adapted to determine an input level signal $L_n$ indicating a signal level $L_{n,i}$ of the main audio signal $S_a$ for each of multiple frequency subbands; a signal classifier 62 adapted to determine a classification signal $S_c$ indicating the presence in the analysis signal $S_n$ of one or more audio signals belonging to a first predefined audio signal class; and an audio analyser 24 adapted to determine a threshold control signal $S_t$ indicating a frequency-dependent level threshold 72, 75, 76, $T_f$ for multiple frequency subbands in dependence on the classification signal $S_c$. The signal processor is preferably further adapted to determine the frequency-dependent gain in dependence on signal levels $L_{n,i}$ indicated by the input level signal $L_n$ and on the frequency-dependent level threshold 72, 75, 76, $T_f$. The audio analyser 24 is preferably further adapted to determine the frequency dependency of the frequency-dependent level threshold 72, 75, 76, $T_f$ in dependence on the classification signal $S_c$.

The signal processor 8 is preferably further adapted to apply the frequency-dependent gain such that the signal processor 8 causes an attenuation and/or a level limitation of the audio output signal $S_o$ in one or more frequency subbands for which the input level signal $L_n$ indicates a signal level exceeding the frequency-dependent level threshold 72, 75, 76, $T_f$ indicated by the threshold control signal $S_t$.

The signal classifier 62 is preferably further adapted to indicate in the classification signal $S_c$ the presence in the analysis signal $S_n$ of one or more audio signals belonging to a second predefined audio signal class different from the first predefined audio signal class.

The signal processor 8 preferably further comprises a delay buffer 40 adapted to provide the main audio signal $S_a$ such that it is delayed by a time delay $t_d$ with respect to the analysis signal $S_n$ and is preferably further adapted to determine the input level signal $L_n$, the frequency-dependent gain, the classification signal $S_c$ and/or the threshold control signal $S_t$ in dependence on the analysis signal $S_n$.

The signal processor preferably further comprises a speech level normalizer 22 adapted to: determine a level $L_s$ of speech in the audio input signal $S_i$; compare the determined speech level $L_s$ with a target speech level $T_s$; and attenuate and/or amplify the audio input signal $S_i$ to reduce a difference between a level of speech in the resulting normalized signal $S_n$ and the target speech level $T_s$, and the signal processor is preferably further adapted to provide the analysis signal $S_n$ and/or the main audio signal $S_a$ in dependence on the normalized signal $S_n$.

The speech level normalizer 22 is preferably further adapted to interrupt or slow down adaptation to the speech level $L_s$, e.g. by interrupting or slowing down the determination of the speech level $L_s$, the attenuation of the audio input signal $S_i$ and/or the amplification of the audio input signal $S_i$, in dependence on the classification signal $S_c$ indicating the presence in the audio input signal $S_i$ of one or more audio signals belonging to a predefined signal class.

The audio analyser 24 is preferably further adapted to: indicate a first frequency-dependent level threshold 72, 75, 76, $T_f$ in the threshold control signal $S_t$ in dependence on the classification signal $S_c$ indicating the absence in the audio input signal $S_i$ of audio signals belonging to the first predefined signal class; and indicate a second frequency-dependent level threshold 72, 75, 76, $T_f$ in the threshold control signal $S_t$ in dependence on the classification signal $S_c$ indicating the presence in the audio input signal $S_i$ of one or more audio signals belonging to the first predefined signal class, such that one or more portions $T_{f,i}$ of the second frequency-dependent level threshold 72, 75, 76, $T_f$ are lower than the corresponding portions $T_{f,i}$ of the first frequency-dependent level threshold 72, 75, 76, $T_f$.

The apparatus may further comprise a sound interface device 2 adapted to provide a sound signal to an ear canal of a user in dependence on the audio output signal $S_o$.

The apparatus may further comprise an earphone adapted to provide a sound signal to an ear canal of a user in dependence on the audio output signal $S_o$.

The apparatus may further comprise a detachable connector 6 for connecting to a sound interface device 2 and may further be adapted to provide the audio output signal $S_o$ to the sound interface device 2 through the connector 6. The detachable connector 6 may be wired or wireless.

The apparatus may be embodied as a headset controller 1 connectable to a headset 2 through a detachable connector 6 and adapted to attenuate undesired content in an audio output signal $S_o$ provided through the detachable connector 6. The apparatus preferably comprises a signal processor 8 connected to receive an audio input signal $S_i$ and adapted to: provide an analysis signal $S_n$ in dependence on the audio input signal $S_i$; provide a main audio signal $S_a$ in dependence on the audio input signal $S_i$; and apply a frequency-dependent gain to the main audio signal $S_a$ to provide the audio output signal $S_o$. The signal processor 8 preferably comprises: a spectrum analyser 43 adapted to determine an input level signal $L_n$ indicating a signal level $L_{n,i}$ of the main audio signal $S_a$ for each of multiple frequency subbands; a signal classifier 62 adapted to determine a classification signal $S_c$ indicating the presence in the analysis signal $S_n$ of one or more audio signals belonging to a first predefined audio signal class; and an audio analyser 24 adapted to determine a threshold control signal $S_t$ indicating a frequency-dependent level threshold 72, 75, 76, $T_f$ for multiple frequency subbands in dependence on the classification signal $S_c$, and the signal processor is preferably further adapted to determine the frequency-dependent gain in dependence on signal levels $L_{n,i}$ indicated by the input level signal $L_n$ and on the frequency-dependent level threshold 72, 75, 76, $T_f$. The audio analyser is preferably further adapted to determine the frequency dependency of the frequency-dependent level threshold 72, 75, 76, $T_f$ in dependence on the classification signal $S_c$.

The invention may be embodied as a machine- or computer-implemented method for attenuating undesired content in an audio signal. The method may preferably comprise: by a signal processor 8, receiving an audio input signal $S_i$; by the signal processor 8, providing a main audio signal $S_a$ in dependence on the audio input signal $S_i$; by a spectrum analyser 43 comprised by the signal processor 8, determining an input level signal $L_n$ indicating a signal level $L_{n,i}$ of the main audio signal $S_a$ for each of multiple frequency subbands; by the signal processor 8, providing an analysis signal $S_n$ in dependence on the audio input signal $S_i$; by a signal classifier 62 comprised by the signal processor 8, determining a classification signal $S_c$ indicating the presence in the analysis signal $S_n$ of one or more audio signals belonging to a first predefined audio signal class; by an audio analyser 24 comprised by the signal processor 8, determining a threshold control signal $S_t$ indicating a frequency-dependent level threshold 72, 75, 76, $T_f$ for multiple frequency subbands in dependence on the classification signal $S_c$; by the signal processor 8, determining a frequency-dependent gain in dependence on signal levels $L_{n,i}$ indicated by the input level signal $L_n$ and the frequency-dependent level threshold 72, 75, 76, $T_f$ indicated by the threshold control signal $S_t$; and by the signal processor 8, applying the frequency-dependent gain to the main audio signal $S_a$ to provide an audio output signal $S_o$. Most preferably, the frequency dependency of the frequency-dependent level threshold 72, 75, 76, $T_f$ indicated by the threshold control signal $S_t$ depends on the classification signal $S_c$.

Preferably, the classification signal $S_c$ further indicates one or more signal parameters characterizing a detected signal component, and the frequency-dependent level threshold 72, 75, 76, $T_f$, in particular its frequency dependency, is determined in further dependency on one or more signal parameters indicated by the classification signal $S_c$.

The one or more signal parameters preferably comprise a frequency, a bandwidth, a level, a power and/or an energy of a detected signal component.

Preferably, applying the frequency-dependent gain causes an attenuation and/or a level limitation of the audio output signal $S_o$ in one or more frequency subbands for which the input level signal $L_n$ indicates a signal level $L_{n,i}$ exceeding the frequency-dependent level threshold 72, 75, 76, $T_f$ indicated by the threshold control signal $S_t$.

Preferably, the classification signal $S_c$ further indicates the presence in the analysis signal $S_n$ of one or more audio signals belonging to a second predefined audio signal class different from the first predefined audio signal class.

Preferably, the method further comprises: by the signal processor 8, providing the main audio signal $S_a$ such that it is delayed by a time delay $t_d$ with respect to the analysis signal $S_n$; and by the signal processor 8, determining the input level signal $L_n$, the frequency-dependent gain, the classification signal $S_c$ and/or the threshold control signal $S_t$ in dependence on the analysis signal $S_n$.

Preferably, the method further comprises: by the signal processor 8, determining a level $L_s$ of speech in the audio input signal $S_i$; by the signal processor 8, comparing the determined speech level $L_s$ with a target speech level $T_s$; by the signal processor 8, attenuating and/or amplifying the audio input signal $S_i$ to reduce a difference between a level of speech in the resulting normalized signal $S_n$ and the target speech level $T_s$; and by the signal processor 8, providing the analysis signal $S_n$ and/or the main audio signal $S_a$ in dependence on the normalized signal $S_n$.

Preferably, the method further comprises: by the signal processor 8, interrupting or slowing down the determination of the speech level $L_s$, the attenuation of the audio input signal $S_i$ and/or the amplification of the audio input signal $S_i$ in dependence on the classification signal $S_c$ indicating the presence in the audio input signal $S_i$ of one or more audio signals belonging to a predefined signal class.

Preferably, the method further comprises: by the signal processor 8, indicating a first frequency-dependent level threshold 71, $T_f$ in the threshold control signal $S_t$ in dependence on the classification signal $S_c$ indicating the absence in the audio input signal $S_i$ of audio signals belonging to the first predefined signal class; and by the signal processor 8, indicating a second frequency-dependent level threshold 72, 75, 76, $T_f$ in the threshold control signal $S_t$ in dependence on the classification signal $S_c$ indicating the presence in the audio input signal $S_i$ of one or more audio signals belonging to the first predefined signal class, such that one or more portions $T_{f,i}$ of the second frequency-dependent level threshold 72, 75, 76, $T_f$ are lower than the corresponding portions $T_{f,i}$ of the first frequency-dependent level threshold 71, $T_f$.

Preferably, the method further comprises: by the signal processor 8, determining a broadband signal level $L_b$ in dependence on the audio input signal $S_i$; by the signal processor 8, comparing the determined broadband signal level $L_b$ with a broadband level threshold $T_b$; and by the signal processor 8, attenuating the audio output signal $S_o$ in dependence on the determined broadband signal level $L_b$ exceeding the broadband level threshold $T_b$.

Preferably, the method further comprises: by the signal processor 8, determining the target speech level $T_s$ and/or the broadband level threshold $T_b$ in dependence on the classification signal $S_c$.

Preferably, the method further comprises: by the signal processor 8, receiving an in-ear audio signal indicating a frequency-dependent sound level in an ear canal of a user and/or an ambient noise signal indicating a frequency-dependent sound level in a user's ambient space; and by the signal processor 8, determining the classification signal $S_c$, the frequency-dependent level threshold 72, 75, 76, $T_f$, the target speech level $T_s$ and/or the broadband level threshold $T_b$ in dependence on the in-ear audio signal and/or the ambient noise signal.

Preferably, the method further comprises: by a sound transducer 2 connected to the signal processor 8, providing a sound signal to an ear canal of a user in dependence on the audio output signal $S_o$.

The method may be implemented and thus executed by a machine that functions as and/or is embodied as a signal processing circuit or a signal processor, such as e.g. the signal processor 8 described further above. Such a machine may comprise one or more analog electronic circuits, one or more digital electronic circuits and/or one or more programmable processors or computers. The machine may thus be programmable with regard to some or all of its functions. The method may be implemented as a computer-executable program. The program may be executed by a programmable machine or a programmable computer, such as e.g. a programmable signal processing circuit. Within the present context, the terms "programmable signal processing circuit" and "programmable signal processor" encompass any programmable computing or processing circuit or device that is capable of real-time processing an audio signal. Examples of signal processing circuits and signal processors falling within this definition comprise e.g. dedicated signal processor chips, microcontrollers, personal computers, general-purpose computers, mobile phones, tablet computers, etc. The program may e.g. be stored on a non-transient storage medium, which may thus comprise instructions for causing a programmable signal processing circuit to execute the method.

In any embodiment, the signal conditioner 1, the signal processor 8 and/or the machine preferably comprises one or more electronic circuits, such as e.g. analog circuits, digital circuits, microprocessors, signal processors or the like, adapted to perform the described operations as is already known for similar devices of the prior art. Such electronic circuits are preferably implemented as digital circuits operating on digital signals, but any portions hereof may be implemented as analog circuits operating on analog signals. Where necessary, any of the electronic circuits may comprise analog-to-digital and/or digital-to-analog converters. Functional blocks of digital circuits may be implemented in hardware, firmware or software, or any combination hereof. Digital circuits may perform the functions of multiple functional blocks in parallel and/or in interleaved sequence, and functional blocks may distributed in any suitable way among multiple hardware units, such as e.g. signal processors, microcontrollers and other integrated circuits.

The detailed description given herein and the specific examples indicating preferred embodiments of the invention are intended to enable a person skilled in the art to practice the invention and should thus be seen mainly as an illustration of the invention. The person skilled in the art will be able to readily contemplate further applications of the present invention as well as advantageous changes and modifications from this description without deviating from the scope of the invention. The mere mentioning of such changes or modifications herein is meant to be non-limiting for the scope of the invention.

The invention is not limited to the embodiments disclosed herein, and the invention may be embodied in other ways within the subject-matter defined in the following claims. As an example, features of the described embodiments may be combined arbitrarily, e.g. in order to adapt the methods or devices according to the invention to specific requirements or uses.

Reference numerals and literal identifiers that appear in brackets in the claims are intended to be non-limiting for their scope.

The invention claimed is:

1. A machine-implemented method for attenuating undesired content in an audio signal, the method comprising:
   by a signal processor, receiving an audio input signal;
   by the signal processor, providing a main audio signal in dependence on the audio input signal;
   by a spectrum analyser comprised in the signal processor, determining an input level signal indicating a signal level of the main audio signal for each of multiple frequency subbands;
   by the signal processor, providing an analysis signal in dependence on the audio input signal;
   by a signal classifier comprised in the signal processor, determining a classification signal indicating the presence in the analysis signal of one or more audio signals belonging to a first predefined audio signal class;
   by an audio analyser comprised in the signal processor, determining a threshold control signal indicating a frequency-dependent level threshold for multiple frequency subbands in dependence on the classification signal such that the frequency dependency of the frequency-dependent level threshold indicated by the threshold control signal depends on the classification signal;
   by the signal processor, determining a frequency-dependent gain in dependence on signal levels indicated by the input level signal and on the frequency-dependent level threshold indicated by the threshold control signal;
   and by the signal processor, applying the frequency-dependent gain to the main audio signal to provide an audio output signal.

2. A method according to claim 1, wherein applying the frequency-dependent gain causes an attenuation and/or a level limitation of the audio output signal in one or more frequency subbands for which the input level signal indicates a signal level exceeding the frequency-dependent level threshold indicated by the threshold control signal.

3. A method according to claim 1, wherein the classification signal further indicates the presence in the analysis signal of one or more audio signals belonging to a second predefined audio signal class different from the first predefined audio signal class.

4. A method according to claim 1 and further comprising:
by the signal processor, providing the main audio signal such that it is delayed by a time delay with respect to the analysis signal;
and by the signal processor, determining the input level signal, the frequency-dependent gain, the classification signal and/or the threshold control signal in dependence on the analysis signal.

5. A method according to claim 1 and further comprising:
by the audio analyser, indicating a first frequency-dependent level threshold in the threshold control signal in dependence on the classification signal indicating the absence in the audio input signal of audio signals belonging to the first predefined signal class;
and by the audio analyser, indicating a second frequency-dependent level threshold in the threshold control signal in dependence on the classification signal indicating the presence in the audio input signal of one or more audio signals belonging to the first predefined signal class, such that one or more portions of the second frequency-dependent level threshold are lower than the corresponding portions of the first frequency-dependent level threshold.

6. A method according to claim 1 and further comprising:
by the signal processor, providing the audio output signal to a headset;
and by a sound transducer comprised in the headset, providing a sound signal to an ear canal of a user in dependence on the audio output signal.

7. A non-transitory storage medium comprising instructions for causing a signal processor to execute a method according to claim 1.

8. An apparatus for attenuating undesired content in an audio signal, the apparatus comprising a signal processor connected to receive an audio input signal and configured to:
provide an analysis signal in dependence on the audio input signal;
provide a main audio signal in dependence on the audio input signal;
and apply a frequency-dependent gain to the main audio signal to provide an audio output signal, the signal processor comprising:
a spectrum analyser configured to determine an input level signal indicating a signal level of the main audio signal for each of multiple frequency subbands;
a signal classifier configured to determine a classification signal indicating the presence in the analysis signal of one or more audio signals belonging to a first predefined audio signal class;
and an audio analyser configured to determine a threshold control signal indicating a frequency-dependent level threshold for multiple frequency subbands in dependence on the classification signal,
the signal processor further being configured to determine the frequency-dependent gain in dependence on signal levels indicated by the input level signal and on the frequency-dependent level threshold,
wherein the audio analyser further is configured to determine the frequency dependency of the frequency-dependent level threshold in dependence on the classification signal.

9. An apparatus according to claim 8, wherein the signal processor further is configured to apply the frequency-dependent gain such that the signal processor causes an attenuation and/or a level limitation of the audio output signal in one or more frequency subbands for which the input level signal indicates a signal level exceeding the frequency-dependent level threshold indicated by the threshold control signal.

10. An apparatus according to claim 8, wherein the signal classifier further is configured to indicate in the classification signal the presence in the analysis signal of one or more audio signals belonging to a second predefined audio signal class different from the first predefined audio signal class.

11. An apparatus according to claim 8, wherein the signal processor further comprises a delay buffer configured to provide the main audio signal such that it is delayed by a time delay with respect to the analysis signal, and wherein the signal processor further is configured to determine the input level signal, the frequency-dependent gain, the classification signal and/or the threshold control signal in dependence on the analysis signal.

12. An apparatus according to claim 8, wherein the signal processor further comprises a speech level normalizer configured to:
determine a level of speech in the audio input signal;
compare the determined speech level with a target speech level;
and attenuate and/or amplify the audio input signal to reduce a difference between a level of speech in the resulting normalized signal and the target speech level,
wherein the signal processor further is configured to provide the analysis signal and/or the main audio signal in dependence on the normalized signal.

13. An apparatus according to claim 12, wherein the speech level normalizer further is configured to interrupt or slow down adaptation to the speech level by interrupting or slowing down the determination of the speech level, the attenuation of the audio input signal and/or the amplification of the audio input signal in dependence on the classification signal indicating the presence in the audio input signal of one or more audio signals belonging to a predefined signal class.

14. An apparatus according to claim 8, wherein the audio analyser further is configured to:
indicate a first frequency-dependent level threshold in the threshold control signal in dependence on the classification signal indicating the absence in the audio input signal of audio signals belonging to the first predefined signal class;
and indicate a second frequency-dependent level threshold in the threshold control signal in dependence on the classification signal indicating the presence in the audio input signal of one or more audio signals belonging to the first predefined signal class, such that one or more portions of the second frequency-dependent level threshold are lower than the corresponding portions of the first frequency-dependent level threshold.

15. An apparatus according to claim 8 and further comprising a sound interface device configured to provide a sound signal to an ear canal of a user in dependence on the audio output signal.

16. An apparatus according to claim 8 and further comprising an earphone configured to provide a sound signal to an ear canal of a user in dependence on the audio output signal.

17. An apparatus according to claim 8 and further comprising a detachable connector for connecting to a sound interface device, wherein the apparatus is configured to provide the audio output signal to the sound interface device through the connector.

18. A headset controller connectable to a headset through a detachable connector and configured to attenuate undesired content in an audio signal provided through the detachable connector, the apparatus comprising a signal processor connected to receive an audio input signal and configured to:
  provide an analysis signal in dependence on the audio input signal;
  provide a main audio signal in dependence on the audio input signal;
  and apply a frequency-dependent gain to the main audio signal to provide an audio output signal through the detachable connector, the signal processor comprising:
  a spectrum analyser to determine an input level signal indicating a signal level of the main audio signal for each of multiple frequency subbands;
  a signal classifier adapted to determine a classification signal indicating the presence in the analysis signal of one or more audio signals belonging to a first predefined audio signal class;
  and an audio analyser configured to determine a threshold control signal indicating a frequency-dependent level threshold for multiple frequency subbands in dependence on the classification signal,
  the signal processor further being configured to determine the frequency-dependent gain in dependence on signal levels indicated by the input level signal and on the frequency-dependent level threshold,
  wherein the audio analyser further is configured to determine the frequency dependency of the frequency-dependent level threshold in dependence on the classification signal.

* * * * *